US010114038B2

(12) United States Patent
Tong et al.

(10) Patent No.: US 10,114,038 B2
(45) Date of Patent: Oct. 30, 2018

(54) FORCE BIASED SPRING PROBE PIN ASSEMBLY

(71) Applicant: Texas Instruments Incorporated, Dallas, TX (US)

(72) Inventors: Kay Chan Tong, Plano, TX (US); Hisashi Ata, Murphy, TX (US); Thiha Shwe, Murphy, TX (US); Phillip Marcus Blitz, Farmers Branch, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 409 days.

(21) Appl. No.: 14/980,953

(22) Filed: Dec. 28, 2015

(65) Prior Publication Data

US 2017/0184632 A1    Jun. 29, 2017

(51) Int. Cl.
  *H01R 13/24*    (2006.01)
  *G01R 1/067*    (2006.01)
  *H01R 11/18*    (2006.01)

(52) U.S. Cl.
  CPC .......... *G01R 1/06722* (2013.01); *H01R 11/18* (2013.01); *H01R 13/2421* (2013.01); *H01R 13/2428* (2013.01)

(58) Field of Classification Search
  CPC . H01R 11/18; H01R 13/2421; H01R 13/2428
  (Continued)

(56) References Cited

U.S. PATENT DOCUMENTS 5,993,269 A    11/1999   Ito
7,315,176 B2 *  1/2008   Nelson ............... G01R 1/06722
                                                      324/755.05

(Continued)

FOREIGN PATENT DOCUMENTS

WO    2013188300    12/2013

*Primary Examiner* — Tho D Ta
(74) *Attorney, Agent, or Firm* — Ronald O. Neerings; Charles A. Brill; Frank D. Cimino

(57) ABSTRACT

A force-biased spring probe pin assembly includes a barrel member having a barrel wall defining an elongate internal cavity with a lower end and an upper end. The assembly also includes a first plunger member reciprocally mounted in the internal cavity proximate the lower end of the internal cavity. A spring member is positioned in the internal cavity between the plunger member and the second end of the internal cavity. At least one rectangular cavity formed in the plunger member with a movable cylindrical bearing in the cavity that applies a slight transverse force to the plunger member ensuring good electrical contact between the plunger and the wall of the barrel member. A force-biased spring probe pin assembly includes a barrel member having a barrel wall defining an elongate internal cavity with a lower end and an upper end. The assembly also includes a first plunger member reciprocally mounted in the internal cavity proximate the lower end of the internal cavity and a second plunger member reciprocally mounted in the internal cavity proximate the upper end of the internal cavity. A spring member is positioned in the internal cavity between the first plunger member and the second plunger member. At least one rectangular cavity formed in the first plunger member with a first movable cylindrical bearing in the cavity that applies a slight transverse force to the first plunger member ensuring good electrical contact between the first plunger member and the wall of the barrel member and at least one rectangular cavity formed in the second plunger member with a second movable cylindrical bearing in the cavity that applies a slight transverse force to the second plunger member ensuring good electrical contact between the second plunger member and the wall of the barrel member.

25 Claims, 5 Drawing Sheets

(58) Field of Classification Search
USPC .................................................. 439/700, 824
See application file for complete search history.

(56) References Cited

U.S. PATENT DOCUMENTS

| | | | |
|---|---|---|---|
| 7,816,929 B2 | 10/2010 | Yamada | |
| 7,845,955 B2 | 12/2010 | Nakayama et al. | |
| 8,905,795 B2 * | 12/2014 | Kim | H01R 13/62 |
| | | | 439/482 |
| 9,385,461 B2 * | 7/2016 | Mori | H01R 13/2421 |
| 9,431,742 B2 * | 8/2016 | DiFonzo | H01R 13/17 |
| 2013/0095690 A1 | 4/2013 | Kim et al. | |

* cited by examiner

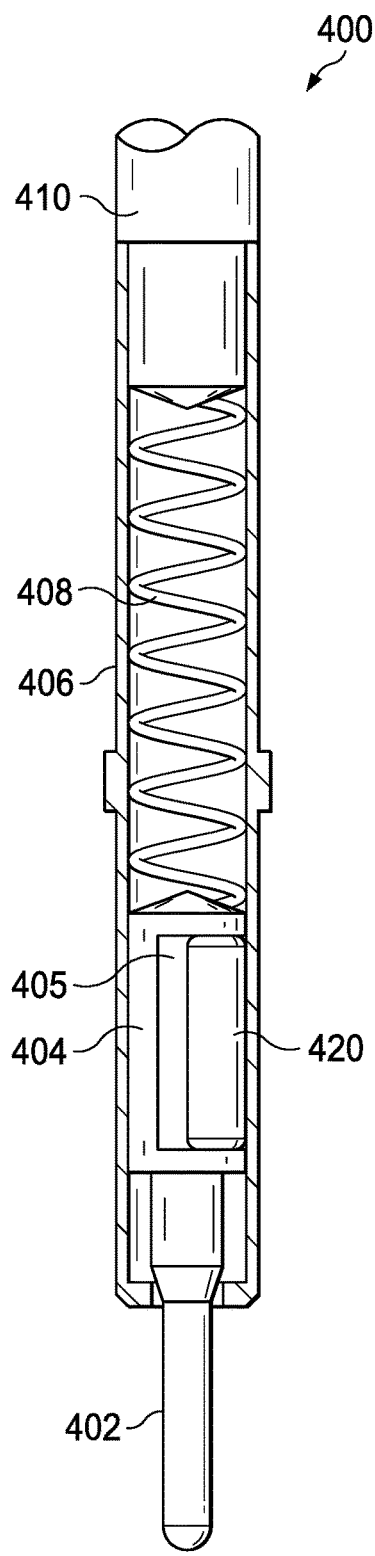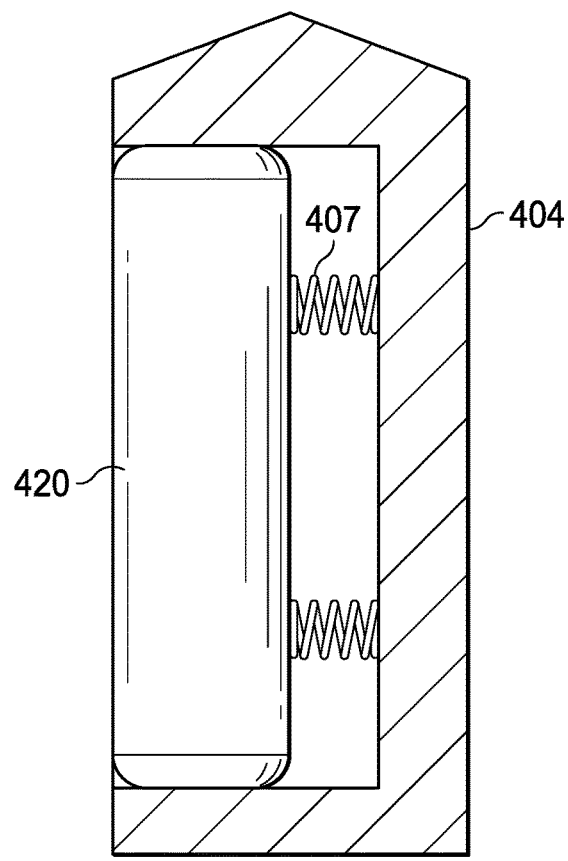
FIG. 4A
FIG. 4B

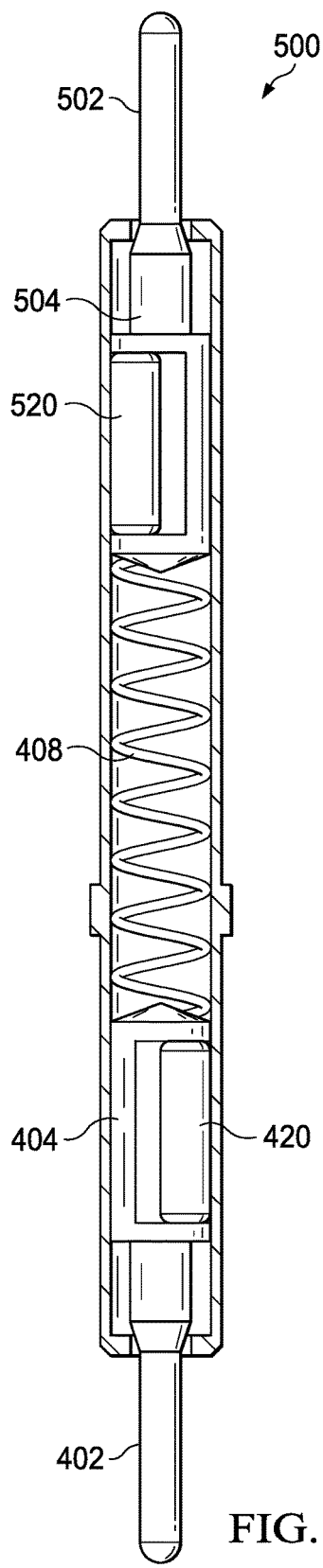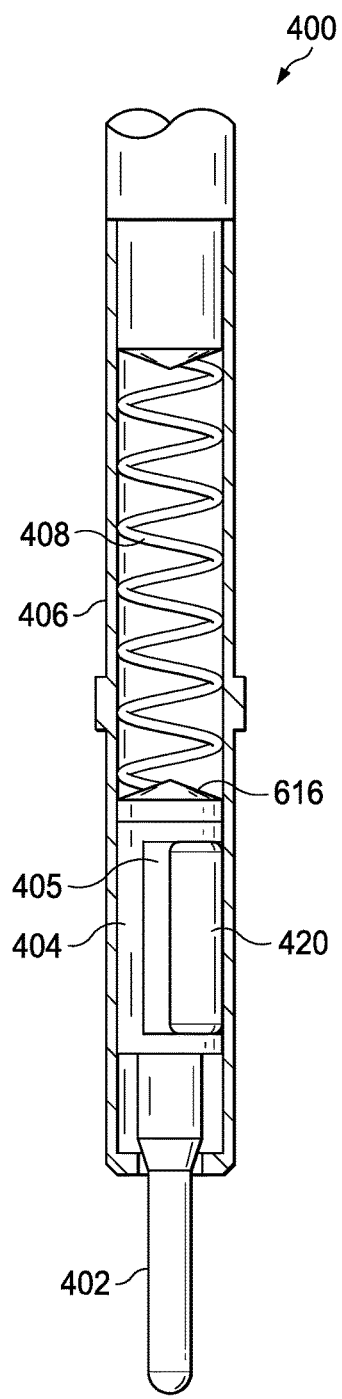
FIG. 5
FIG. 6 ially with this application, U.S. patent application Ser. No.
FORCE BIASED SPRING PROBE PIN ASSEMBLY

CROSS REFERENCE TO RELATED APPLICATIONS

The following patent applications are related and hereby incorporated by reference: U.S. patent application Ser. No. 14/980,353, now U.S. Pat. No. 9,698,513, filed simultaneously with this application, U.S. patent application Ser. No. 14/980,877, now U.S. Pat. No. 9,775,344, filed simultaneously with this application, and U.S. patent application Ser. No. 14/981,044, filed simultaneously with this application. With the mention in this section, these patent applications are not admitted to be prior art with respect to the present invention.

This application is related to patent application Ser. No. 14/863,198, filed Sep. 23, 2015, now U.S. Pat. No. 9,673, 539, entitled "Spring Biased Probe Pin Assembly," with its mention in this section, this patent application is not admitted to be prior art with respect to the present invention.

FIELD

This invention relates a force-biased spring probe pin.

BACKGROUND

A spring probe pin assembly is often also referred to as a Pogo™ pin. Pogo™ is a registered trademark of Xcerra Corporation in Norwood, Mass. A spring probe pin or Pogo™ assembly is a device used in electronics to establish an electrical connection between two circuits. Pogo™ pins are usually arranged in a dense array, connecting together many individual nodes of two circuits or circuit boards. Pogo™ pin connectors are commonly found in automatic test equipment (ATE) in the form of a bed of nails where they facilitate the rapid, reliable connection of the devices under test. A Pogo™ pin connector may contain just a few Pogo™ pins to many hundred Pogo™ pins. In one extremely high-density configuration, the array takes the form of a ring containing hundreds or thousands of individual pogo pins; this device is sometimes referred to as a pogo tower.

Pogo™ pin connectors are also commonly used to form reliable, non permanent electrical contacts in electrical equipment. For example an electronic device with multiple electrical connections may be plugged into an piece of electrical equipment and secured in place for example by a snap connector, a spring, or screws. A Pogo™ pin connector may be used to establish electrical connection. An electronic device installed in electrical equipment in this manner may be easily be removed and replaced without the need of special equipment. This is especially convenient for repairing or updated electrical equipment in the field. For example, Pogo™ pin connectors are used for the installation of devices in the Cray 2 computer.

As shown in FIG. 1, a spring probe pin assembly 100 may have one movable probe pin 102 at one end of the cylindrical barrel member 106 and an immovable pin 116 attached to a closed end of the cylindrical barrel member 106. As shown in FIG. 2 the spring probe pin assembly 200 may have two movable probe pins, 202 and 216, one at each opposing open ends of the cylindrical barrel member 106.

The spring 108 forces the plunger 104 (or plungers 204 and 210 in FIG. 2) into electrical contact with the wall of the barrel member 106. As is illustrated by the arrows 112 in FIG. 1, the current typically flows from the probe pad on the integrated circuit through the probe pin 102, through the plunger 104, through the wall of the barrel member 106, and into the head 110 of the spring probe pin assembly (or the upper plunger 210 and the upper probe pin 216 in FIG. 2).

Although the spring 108 typically forms an electrical path in parallel with the cylindrical barrel member 106 of the spring probe pin assembly, the resistance of the spring is typically so much higher than the resistance of the wall of the barrel member 106 that an insignificant amount of current flows through the spring 108.

A common problem that may arise with a conventional spring probe pin assembly 300 during use is illustrated in FIG. 3. After repeated use, due to wear the contact 314 and 316 between the plunger 304 and the wall of the barrel member 306 may be degraded resulting in increased resistance. The increased resistance may result in an increase in current flowing through the spring 308. Current greater than about 200 mA through the spring 308 of a spring probe pin assembly 300 may cause the spring 308 to heat up and lose temper or may cause the spring 308 to melt.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A force-biased spring probe pin assembly includes a barrel member having a barrel wall defining an elongate internal cavity with a lower end and an upper end. The assembly also includes a first plunger member reciprocally mounted in the internal cavity proximate the lower end of the internal cavity. A spring member is positioned in the internal cavity between the plunger member and the second end of the internal cavity. At least one rectangular cavity formed in the plunger member with a movable cylindrical bearing in the cavity that applies a slight transverse force to the plunger member ensuring good electrical contact between the plunger and the wall of the barrel member. A force-biased spring probe pin assembly includes a barrel member having a barrel wall defining an elongate internal cavity with a lower end and an upper end. The assembly also includes a first plunger member reciprocally mounted in the internal cavity proximate the lower end of the internal cavity and a second plunger member reciprocally mounted in the internal cavity proximate the upper end of the internal cavity. A spring member is positioned in the internal cavity between the first plunger member and the second plunger member. At least one rectangular cavity formed in the first plunger member with a first movable cylindrical bearing in the cavity that applies a slight transverse force to the first plunger member ensuring good electrical contact between the first plunger member and the wall of the barrel member and at least one rectangular cavity formed in the second plunger member with a second movable cylindrical bearing in the cavity that applies a slight transverse force to the second plunger member ensuring good electrical contact between the second plunger member and the wall of the barrel member.

DESCRIPTION OF THE VIEWS OF THE DRAWINGS

FIG. 4A is a partially transparent view of an example embodiment force-biased single ended spring probe pin assembly with a cylindrical bearing in a rectangular plunger cavity.

FIG. 4B is a partially transparent view of an example embodiment portion of the plunger with a cylindrical bearing in a plunger cavity.

FIG. 5 is a partially transparent view of an example embodiment force-biased dual ended spring probe pin assembly with cylindrical bearings in rectangular plunger cavities.

FIG. 6 is a partially transparent view of an example embodiment of a spring-biased probe pin assembly with cylindrical bearings in rectangular plunger cavities and an insert between the plunger and the spring.

DETAILED DESCRIPTION OF EXAMPLE EMBODIMENTS

Figure 1:
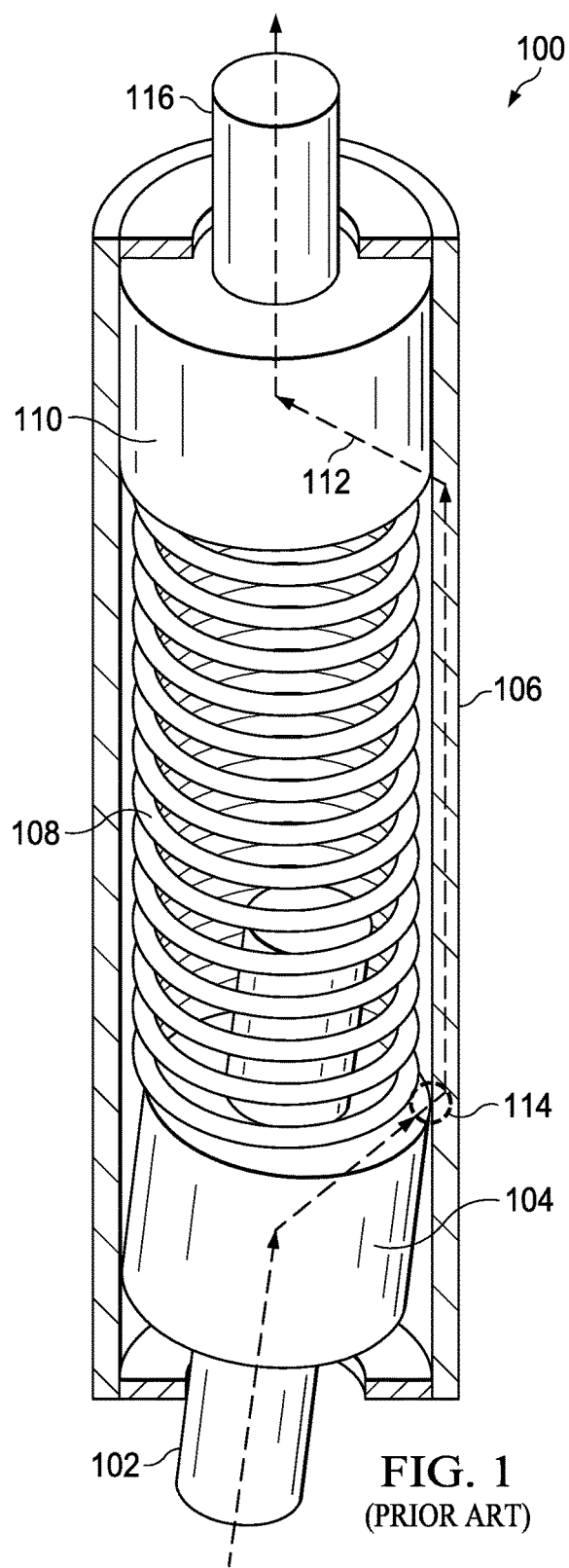
FIG. 1 (Prior art) is a partially transparent view of a prior art single ended spring probe pin assembly.
Figure 2:
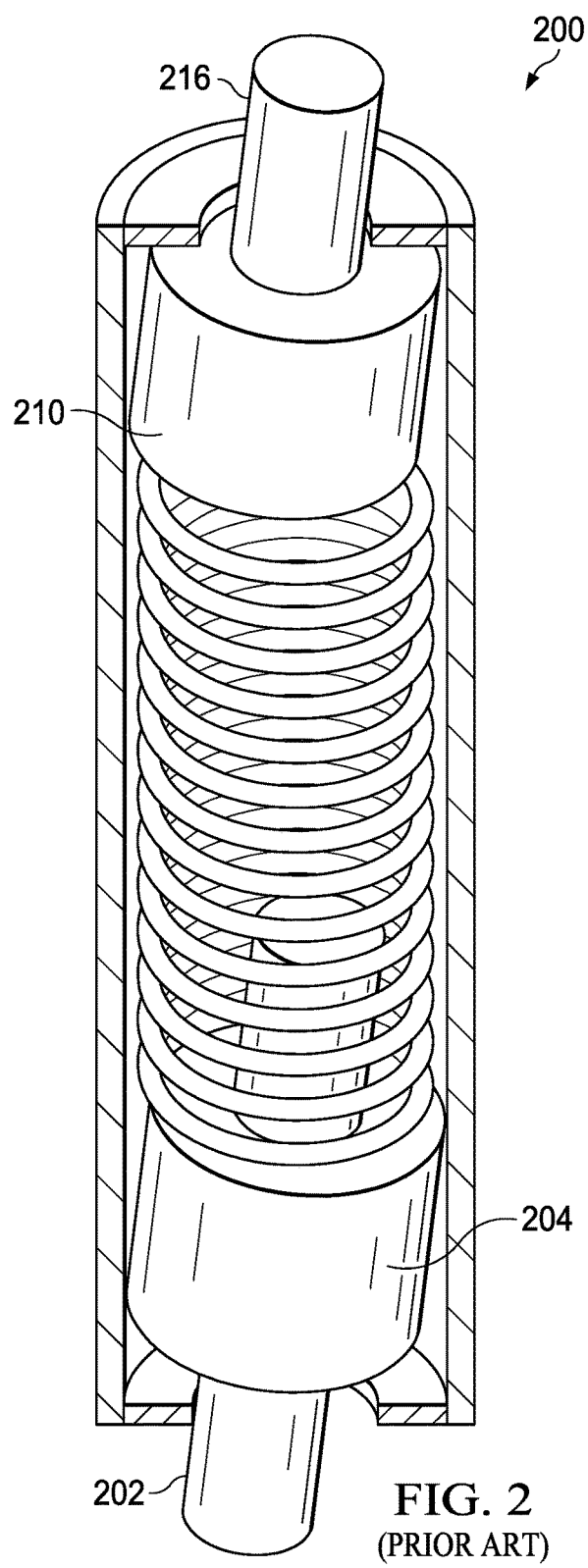
FIG. 2 (Prior art) is a partially transparent view of a prior art dual ended spring probe pin assembly.
Figure 3:
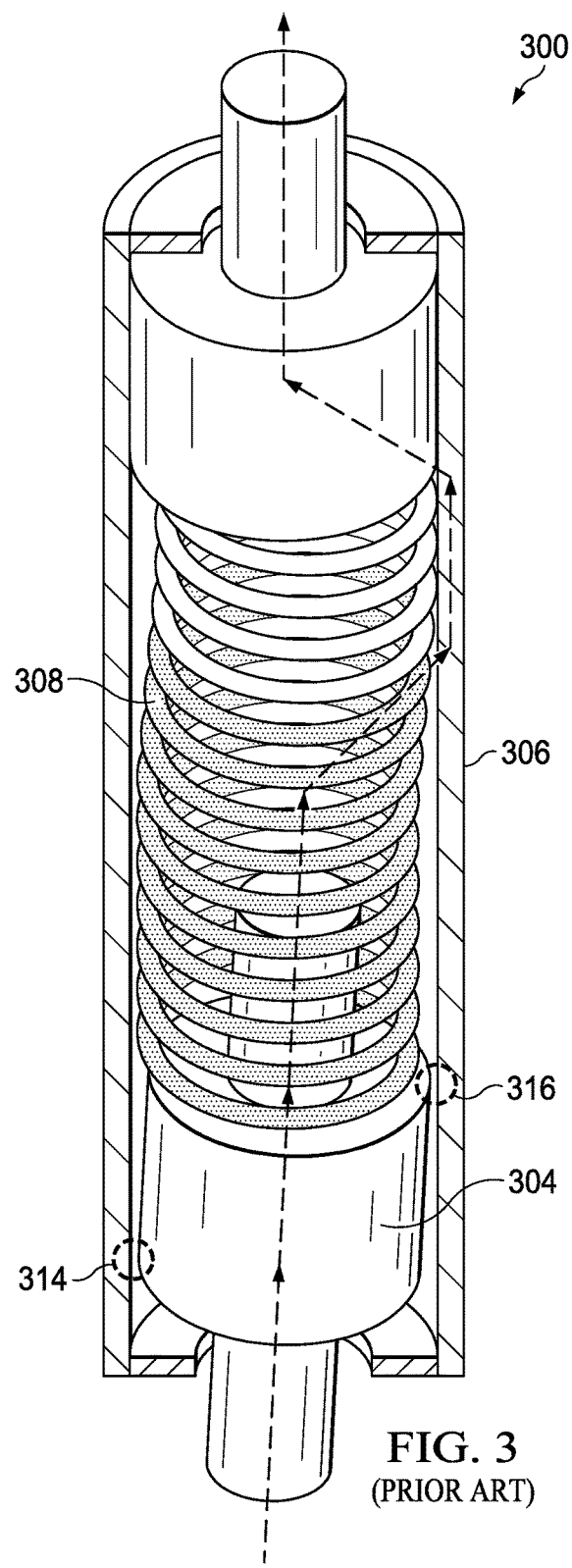
FIG. 3 (Prior art) is a partially transparent view of a failed prior art single ended spring probe pin assembly.

Embodiments of the invention are described with reference to the attached figures. The figures are not drawn to scale and they are provided merely to illustrate the invention. Several aspects of the embodiments are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The embodiments are not limited by the illustrated ordering of acts or events, as some acts may occur in different orders and/or concurrently with other acts or events. Furthermore, not all illustrated acts or events are required to implement a methodology in accordance with the present invention.

As used herein "force-biased spring probe pin assembly" refers to a spring probe pin assembly that has been modified to apply a slight force that ensures good electrical contact between the plunger and the cylindrical barrel to avoid significant current from flowing through and damaging the spring.

Embodiment force-biased spring probe pin assemblies are illustrated in FIG. 4A and FIG. 5. FIG. 4A is a force-biased single ended spring probe pin 402 assembly 400. FIG. 5 is a force-biased dual ended, 402 and 502, spring probe pin assembly 500.

As is illustrated in FIG. 4A, a rectangular cavity is formed within the plunger 404. A movable cylindrical bearing 420, which may be conductive or may be non conductive, within this rectangular cavity applies a slight transverse force to the plunger 404 ensuring good electrical contact between the plunger 404 and the cylindrical barrel 406.

As is illustrated in FIG. 4A, a deformable material 405 such as plastic or rubber may be positioned between the inner wall of the rectangular cavity and the movable cylindrical bearing 420 to apply a slight outward force to the cylindrical bearing 420 to ensure good electrical contact between the plunger 404 and the cylindrical barrel member 406.

Alternatively as shown in FIG. 4B, a metallic spring 407 or springs between the inner wall of the plunger 404 cavity and the movable cylindrical bearing 420 may provide a slight outward force to the plunger 404 to ensure good electrical contact between the plunger 404, and the cylindrical barrel member 406.

One movable cylindrical bearing 420 is shown in FIG. 4A. More movable cylindrical bearings 420 may be used if desired. The movable cylindrical bearings 420 in the embodiment force-biased spring probe pin assembly 400 are found to significantly increase the number of times the force-biased spring probe pin assembly 400 may be used prior to failure.

As is illustrated in FIG. 6, an insert 616 of a non conductive material may be positioned between the spring 408 and the plunger 404 to prevent current from flowing through the spring 408 and damaging it.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A force-biased spring probe pin assembly comprising:
   a cylindrical barrel member having a barrel wall defining an elongate internal cavity with a lower end and an upper end;
   a first plunger member reciprocally mounted In the internal cavity proximate to the lower end of the internal cavity;
   a spring member positioned in the internal cavity between the first plunger member and the upper end of the internal cavity;
   a first cavity formed within the first plunger member; and
   a movable bearing in the first cavity wherein the movable bearing applies a slight transverse force to the first plunger member ensuring good electrical contact between the first plunger member and the barrel member.

2. The assembly of claim 1, wherein the spring probe pin assembly is a Pogo™ assembly.

3. The assembly of claim 1, further including an insert formed of non conductive material and wherein the insert is positioned between the spring member and the first plunger member.

4. The assembly of claim 1, wherein the movable bearing is comprised of a conductive material.

5. The assembly of claim 1, wherein the movable bearing is comprised of a non conductive material.

6. The assembly of claim 1, further including a deformable material within the first cavity wherein the deformable material is positioned between an inside wall of the first cavity and the movable bearing and wherein the deformable material applies a slight outward force to the movable bearing and the first plunger member providing improved electrical contact between the first plunger member and the cylindrical barrel member.

7. The assembly of claim 1, further including a spring within the first cavity wherein the spring is positioned between an inside wall of the first cavity and the movable bearing and wherein the spring applies a slight outward force to the movable bearing and the first plunger member providing improved electrical contact between the first plunger member and the cylindrical barrel member.

8. The assembly of claim 1, wherein the first cavity is rectangular in shape.

9. The assembly of claim 1, wherein the moveable bearing is cylindrical in shape.

10. The assembly of claim 1, wherein the second moveable bearing is cylindrical in shape.

11. The assembly of claim 1, further comprising:
a second plunger member reciprocally mounted in the internal cavity proximate to the upper end;
the spring member positioned in the internal cavity between the first plunger member and the second plunger member;
second cavity formed within the second plunger member; and
a second movable bearing in the second cavity wherein the second movable bearing forms good electrical contact between the second plunger member and the cylindrical barrel member.

12. The assembly of claim 11, wherein the cylindrical elongate internal cavity having a first opening at the lower end and a second opening at the upper end, the first plunger member comprising a first probe pin extending through the first opening and the second plunger member comprising a second probe pin extending through the second opening.

13. The assembly of claim 11, wherein when the spring member applies a force in opposing directions to the first and second plunger members.

14. The assembly of claim 1, wherein the elongate internal cavity having a first opening at the lower end and the first plunger member comprising a first probe pin extending through the first opening.

15. The assembly of claim 14, further including an immovable pin attached to a closed end of the cylindrical barrel member proximate the upper end of the internal cavity.

16. A force-biased spring probe pin assembly comprising:
a cylindrical barrel member having a barrel wall defining an elongate internal cavity with a lower end and an upper end;
a first plunger member reciprocally mounted in the internal cavity proximate to the lower end of the internal cavity;
a second plunger member reciprocally mounted in the internal cavity proximate to the upper end of the internal cavity;
a spring member positioned in the internal cavity between the first plunger member and the second plunger member;
at least one first rectangular cavity formed within the first plunger member with a movable cylindrical bearing in the first rectangular cavity wherein the first movable cylindrical bearing applies slight transverse force to the first plunger member insuring good electrical contact between the first plunger member and the barrel member; and
at least one second rectangular cavity formed within the second plunger member with a second movable cylindrical bearing in the second rectangular cavity wherein the second movable cylindrical bearing applies slight transverse force to the second plunger member insuring good electrical contact between the second plunger member and the cylindrical barrel member.

17. The assembly of claim 16, wherein the spring probe pin assembly is a Pogo™ assembly.

18. The assembly of claim 16, the cylindrical barrel member having a first opening at the lower end and a second opening at the upper end, the first plunger member comprising a first probe pin extending through the first opening and the second plunger member comprising a second probe pin extending through the second opening.

19. The assembly of claim 16 further including an insert between the first plunger member and the spring member wherein said insert is composed of a non conductive material.

20. The assembly of claim 16, further comprising:
a deformable material within the first rectangular cavity wherein the deformable material is positioned between an inside wall of the first rectangular cavity and the first movable cylindrical bearing and wherein the deformable material applies a slight outward force to the first movable cylindrical bearing and the first plunger member providing improved electrical contact between the first plunger member and the barrel member; and
a deformable material within the second rectangular cavity wherein the deformable material is positioned between an inside wall of the second rectangular cavity and the second movable cylindrical bearing and wherein the deformable material applies a slight outward force to the second movable cylindrical bearing and to the second plunger member providing improved electrical contact between the second plunger member and the cylindrical barrel member.

21. The assembly of claim 16, further comprising:
a first spring within the first rectangular cavity wherein the first spring is positioned between an inside wall of the first rectangular cavity and the first movable cylindrical hearing and wherein the first spring applies a slight outward force to the first movable cylindrical bearing and the first plunger member providing improved electrical contact between the first plunger member and the cylindrical barrel member; and
a second spring within the second rectangular cavity wherein the second spring is positioned between an inside wall of the second rectangular cavity and the second movable cylindrical bearing and wherein the second spring applies a slight outward force to the second movable bearing and the second plunger member providing improved electrical contact between the second plunger member and the cylindrical barrel member.

22. The assembly of claim 16, wherein the first moveable cylindrical bearing and the second movable cylindrical bearing are comprised of a conductive material.

23. The assembly of claim 16, wherein the first moveable cylindrical bearing and the second movable cylindrical bearing are comprised of a non conductive material.

24. A method of making a force-biased spring probe pin assembly comprising:
providing a cylindrical barrel member having a barrel wall defining an elongate internal cavity with a lower end and an upper end;
providing a first plunger member reciprocally mounted in the Internal cavity proximate to the lower end of the internal cavity;
providing a spring member positioned in the internal cavity between the first plunger member and said supper end of the internal cavity;
providing a first cavity formed within the first plunger member; and
providing a movable bearing in the first cavity wherein the movable bearing applies a slight transverse force to the first plunger member ensuring good electrical contact between the first plunger member and the barrel member.

25. A method of making a force-biased spring probe pin assembly comprising:
- providing a cylindrical barrel member having a barrel wall defining an elongate internal cavity with a lower end and an upper end;
- providing a first plunger member reciprocally mounted in the internal cavity proximate to the lower end of the internal cavity;
- providing a second plunger member reciprocally mounted in the internal cavity proximate to the upper end of the internal cavity;
- providing a spring member positioned in the internal cavity between the first plunger member and the second plunger member;
- providing at least one first rectangular cavity formed within the first plunger member with a first movable cylindrical bearing in the first rectangular cavity wherein the first movable cylindrical bearing applies slight transverse force to the first plunger member insuring good electrical contact between the first plunger member and the barrel member; and
- providing at least one second rectangular cavity formed within the second plunger member with a second movable cylindrical bearing in the second rectangular cavity wherein the second movable cylindrical bearing applies slight transverse force to the second plunger member insuring good electrical contact between the second plunger member and the cylindrical barrel member.

* * * * *